United States Patent [19]

Ishitsuka et al.

[11] Patent Number: 4,791,039
[45] Date of Patent: Dec. 13, 1988

[54] VISIBLE RAY-RECORDING HOLOGRAM MATERIAL

[75] Inventors: Takeshi Ishitsuka, Atsugi; Yasuo Yamagishi, Zama; Akihiro Mochizuki, Atsugi, all of Japan

[73] Assignee: Fujitsu Limited, Kawasaki, Japan

[21] Appl. No.: 14,695

[22] Filed: Feb. 13, 1987

[30] Foreign Application Priority Data

Feb. 20, 1986 [JP] Japan .................................. 61-036356
Oct. 14, 1986 [JP] Japan .................................. 61-242084

[51] Int. Cl.$^4$ ............................................. G03C 1/727
[52] U.S. Cl. ........................................... 430/2; 430/1;
430/270; 430/915; 430/925; 430/945; 522/30;
350/3.61

[58] Field of Search ..................... 430/2, 1, 270, 915,
430/925, 945; 350/3.61; 522/30

[56] References Cited

U.S. PATENT DOCUMENTS 3,640,718  2/1972  Smith ............................ 430/925 X
4,172,724  10/1979  Matsumoto et al. ................ 430/2 X
4,201,441  5/1980  Matsumoto et al. ................ 430/2 X Primary Examiner—Paul R. Michl
Assistant Examiner—Cynthia Hamilton
Attorney, Agent, or Firm—Staas & Halsey

[57] ABSTRACT

A visible ray-recording hologram material comprising a polymer containing a carbazole ring, iodoform, and an aromatic colorant having a fused ring system. This material enables recording with rays having a wavelength of 450 to 550 nm.

9 Claims, 3 Drawing Sheets

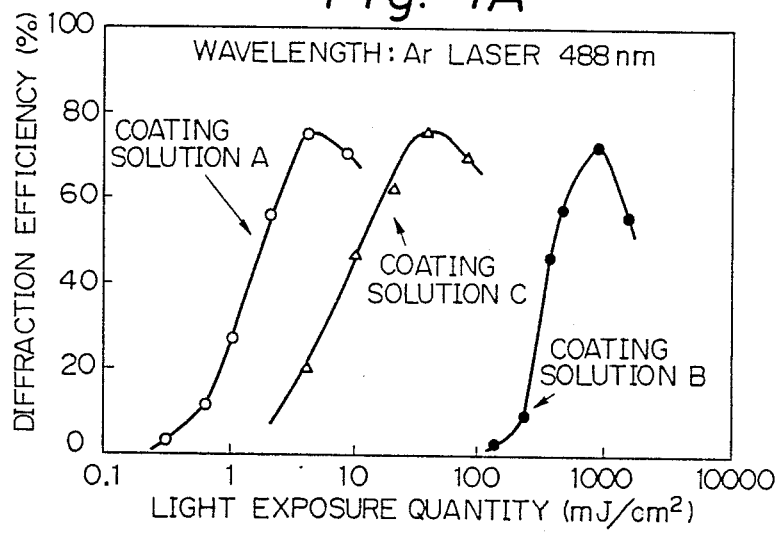
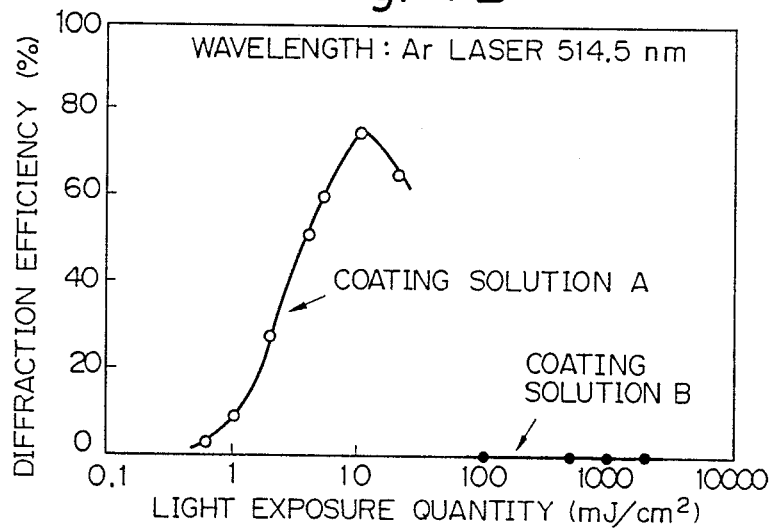

VISIBLE RAY-RECORDING HOLOGRAM MATERIAL

BACKGROUND OF THE INVENTION (1) Field of the Invention

The present invention relates to a visible ray-recording hologram material. More particularly, the present invention relates to a plastic type organic photosensitive material, from which a hologram can be prepared by interference exposure using argon ion laser beams.

(2) Description of the Related Art

A hologram is formed by recording the interference wave fronts of coherent light such as laser beams as the refractive index distribution or light absorption (light and shade) distribution, and the hologram is used not only as a stereoscopic photo but also as an optical element in which the wavelength separating capacity, light focussing capacity or incident angle selecting capacity of the hologram is utilized. For example, trials have been made to utilize the hologram as a beam scanner for a bar code reading device or laser printer, a pickup lens of an optical disc memory, or a mixing window for a head-up display.

When these optical elements are prepared by using a hologram, the material for the hologram must have the following properties.

(1) Recording is possible with a cheap and high-power visible ray laser.

Namely, a cheap and high-power laser having a long coherent length, in which the difference of the wavelength from a reproduction light source (He—Ne laser of 633 nm or semiconductor laser of 780 nm is ordinarily used) is small, is desired as the exposure light source. As the laser of this type, there can be mentioned an argon ion laser and an He—Ne laser. The argon laser in which an especially high output is obtained is excellent as the light source for the production of a hologram.

(2) The sensitivity is high.

By shortening the exposure time, the noise can be reduced and the productivity can be improved.

(3) The diffraction efficiency of the hologram is high.

(4) The hologram has excellent moisture resistance and heat resistance.

(5) The material is colorless and transparent.

As the photosensitive material for the hologram recording, there are used a product obtained by subjecting a silver salt used for an ordinary photographic material to a bleaching treatment and gelatin dichromate. The silver salt and gelatin dichromate have a high sensitivity substantially over the entire visible ray region, but are defective in that the hologram-forming treatment is complicated, and since a gelatin film is used as the binder, the hologram has unsatisfactory environmental resistance characteristics such as moisture resistance, heat resistance, and light resistance.

As the material overcoming these problems, there has been proposed a polymeric hologram recording material comprising poly-N-vinylcarbazole (PVCz) rendered photosensitive by an organic halogen compound generating a halogen radical upon absorption of light (see, for example, Japanese Examined Patent Publications Nos. 56-1620 and 55-31453 and Japanese Unexamined Patent Publications Nos. 53-15153 and 54-102140). However, most halogen compounds are generally colorless or have a very light yellow color, and therefore, this polymeric material is used for the production of a hologram by using ultraviolet rays or near-violet rays. It has been long known that vinylcarbazole is photopolymerized by using a halogen compound (see, for example, Japanese Examined Patent Publication No. 37-16085). Also in this case, the reaction is effected by utilizing ultraviolet rays of a mercury lamp or the like. Of course, a few organic halogen compounds have a sensitivity to visible laser beams, and it is known that recording is possible by an argon ion laser (515 nm) by using carbon tetraiodide (see, for example, Japanese Unexamined Patent Publication No. 53-15153). However, carbon tetraiodide is defective in that it is readily decomposed and the pot life is extremely short because of dark reaction by heat. In fact, a hologram obtained by dissolving 8 g of PVCz in 200 g of chloroform, filtering the solution, adding 0.4 g of carbon tetraiodide to form a coating solution, immediately coating the solution and performing light exposure and development has greatly different characteristics to those of a hologram obtained by coating the coating solution 1 hour after the preparation of the coating solution. Moreover, when this coating solution is allowed to stand for 5 hours (in a dark place at room temperature), gelation is caused and coating is impossible, and it is obvious that the coating solution cannot be put into practical use.

Iodoform having 3 iodine atoms is more stable against heat than carbon tetraiodide, and even if a coating solution prepared in the same manner as described above by using an iodoform is allowed to stand for 1 week after the preparation, the increase of the viscosity is less than 10%. However, iodoform has no substantial absorption of light at about 500 nm (see FIG. 1), and therefore, reproduction of a hologram by rays within this region is difficult.

SUMMARY OF THE INVENTION

It is therefore a primary object of the present invention to provide a moisture-resistant plastic type hologram recording material, from which a hologram can be prepared by interference exposure using visible laser beams, especially argon ion laser beams or other laser beams having an equivalent wavelength.

In accordance with the present invention, this object can be attained by a visible ray-recording hologram material comprising a polymer containing a carbazole ring, iodoform, and an aromatic colorant having a fused ring system. In this material, recording is possible with rays having a wavelength of 450 to 550 nm.

BRIEF DESCRIPTION OF THE DRAWINGS

FIGS. 4A and 4B show the relationship between the light exposure quantity and the diffraction efficiency in holograms obtained by using a photosensitive material comprising poly-N-vinylcarbazole, iodoform and 5,6,11,12-tetraphenylnaphthacene or bis(phenylethynyl)naphthacene and a material comprising poly-N-vinylcarbazole and iodoform, observed when argon ion laser beams having a wavelength of 488 nm and argon ion laser beams having a wavelength of 515 nm are used.

DESCRIPTION OF THE PREFERRED EMBODIMENTS

Figure 1:
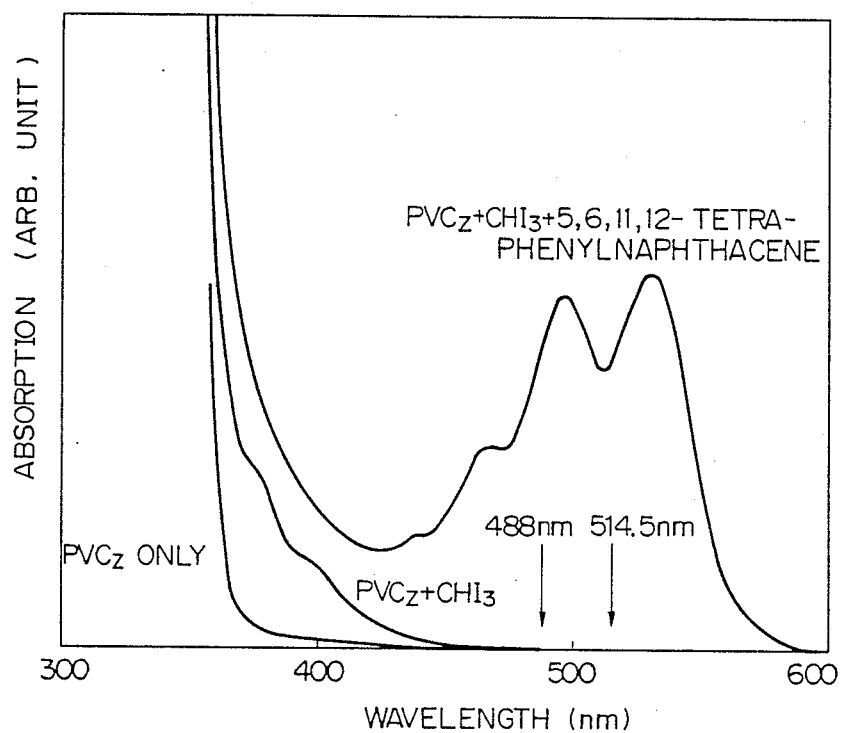
FIG. 1 is a diagram showing absorption spectra of a photosensitive material comprising poly-N-vinylcarbazole, iodoform, and 5,6,11,12-tetraphenylnaphthacene, a material comprising poly-N-vinylcarbazole and iodoform, and poly-N-vinylcarbazole per se.

The present invention is different from the conventional technique in which light is absorbed in the halogen-containing compound, since in the present invention, rays of an argon ion laser or the like are absorbed in a dye having a light absorption band in the visible region, and the energy of the absorbed rays is transferred to the halogen-containing compound to cause a reaction in PVCz. Namely, the light-absorbing function is separated from the function of activating and reacting PVCz, and both of these functions are simultaneously utilized for effecting recording. However, transfer of the energy between the dye and halogen-containing compound is possible only in limited combinations.

We added a dye having an absorption band in the vicinity of a wavelength of 500 nm to a solution comprising a polymer containing a carbazole ring and iodoform having an appropriate reactivity as the halogen compound, and examined the sensitivity to argon ion laser beams (having a wavelength of 488 or 515 nm). As a result, it was found that, if an aromatic colorant having a fused ring system such as a phenylnaphthacene compound is used as the dye, a hologram can be prepared even at a wavelength or light quantity where a hologram cannot be practically prepared if iodoform alone is added. Phenylnaphthacene compounds having a large number of phenyl groups, such as tetraphenylnaphthacene, is especially effective. However, a phenylnaphthacene compound synthesized from a naphthacene derivative comprises a plurality of simultaneously formed phenylnaphthacenes having a different number of phenyl groups and separation of these phenylnaphthacenes is difficult, and separation of isomers containing the same number of phenyl groups is more difficult. Accordingly, the influence of the number or bonding position of the phenyl groups on the optical activity is not sufficiently clear.

In the present invention, the phenylnaphthacene compound per se has no function of causing chemical reaction in PVCz. Namely, the energy of light absorbed in the phenylnaphthacene compound is transferred to iodoform in some form or other. As the process of transfer of energy, the following processes are generally known.
(1) Excited singlet-excited singlet crossing
(2) Excited triplet-excited triplet crossing
(3) Dipole-dipole interaction
(4) Impingement process
(5) Exciton transition In the transfer of energy from a phenylnaphthacene compound to iodoform, since iodoform does not have a double bond ($\pi$ electron), the processes (1) and (2) are not conducted. For the process (3), the fluorescent spectrum on the energy supply side must overlap the extinction spectrum on the energy receipt side. However, iodoform has no absorption in the green-to-near infrared region and, therefore, the process (3) is not advanced by rays having a wavelength of about 500 nm.

Ordinarily, in the long-wavelength sensitization by a dye, the processes (1) though (3) are taken into consideration as processes to be advanced. Therefore, wavelength sensitization of iodoform to visible rays has not been substantially performed.

Therefore, the transfer of energy in a hologram is deemed to be performed through the process (4) or (5). However, since it is considered that exciton is hardly formed by a small energy of a photon, it is considered that the transfer of energy will probably be performed through the impingement process. Namely, it is considered that by the light energy absorbed by the molecule of a phenylnaphthacene as the dye, the molecule is decomposed or swung, and the molecule or molecule fragment impinges against iodoform to activate iodoform. In short, it is considered that the transfer of energy from a phenylnaphthacene to iodoform is performed through this thermal process.

Examples of the carbazole ring-containing polymer usable for the present invention include polyvinyl carbazole, vinyl carbazole-styrene copolymer, vinyl carbazole-vinylidene chloride copolymer, vinyl carbazole-methyl methacrylate copolymer, vinyl carbazole-vinyl anthracene copolymer, vinyl carbazole-vinyl pyridine copolymer, vinyl carbazole-methyl acrylate copolymer, vinyl carbazole-ethyl acrylate copolymer, vinyl carbazole-acrylonitrile copolymer, vinyl carbazole-butyl acrylate copolymer, vinyl carbazole-nitrovinyl carbazole copolymer, nitrated polyvinyl carbazole, polyvinylamino carbazole, vinyl carbazole-N-methylaminovinyl carbazole copolymer, halogene substituted polyvinyl carbazole, vinyl carbazole-dibromovinyl carbazole copolymer, polyiodovinyl carbazole, polybenzilidene vinyl carbazole, polypropenyl carbazole, and a polymer having an ester linkage between the main chain and the carbazole ring. Especially preferred examples are as follows.

(1) Poly-N-vinylcarbazole (PVCz) of the following formula:

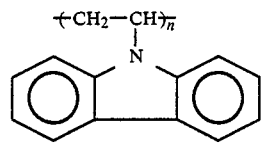

wherein n is a positive integer.

(2) Halogen-substituted PVCz of the following formula:

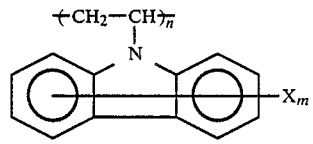

wherein X stands for Cl, Br of I, m is an integer of from 1 to 3, and n is a positive integer.

(3) Polymer having an ester linkage between the main chain and the carbazole ring, which is represented by the following formula:

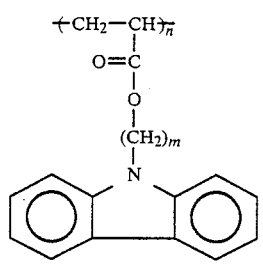

wherein m is an integer of from 1 to 3 and n is a positive integer.

As typical instances of the phenylnaphthacene compound, there can be mentioned 5,6,11,12-tetraphenylnaphthacene and bis(phenylethynyl)naphthacene.

Preferably, iodoform may be added in an amount of 1 to 40 parts, especially 5 to 20 parts by weight per 100 parts by weight of PVCz. Tetraphenylnaphthacene may preferably be added in an amount of 0.1 to 40 parts, especially 0.5 to 10 parts by weight per 100 parts by weight of PVCz.

According to our study, it was found that in the hologram material according to the present invention, as the amount of iodoform added was increased, there were increased not only the sensitivity but also the viscosity. A coating liquid prepared by adding 10 parts by weight of iodoform to 100 parts by weight of PVCz had a viscosity increased by 5% where the liquid was allowed to stand in a dark at room temperature for 1 week, while the viscosity increase of a coating liquid containing 40 parts by weight of iodoform was 50%. Further, a coating liquid containing 80 parts by weight of iodoform could not be used, since opaque regions where iodoform appeared to be separated out were produced on the coated layer. On the other hand, where 5,6,11,12-tetraphenylnaphthacene was added in an amount of up to 10 parts by weight, the sensitivity was increased with the increase of the added amount, while no reduction of the stability of the material, such as viscosity, was observed. The obtained results concerning the sensitivity are shown in the table below.

used singly or in the form of mixtures of two or more thereof. As the poor solvent, there can be used lower alcohols such as ethanol and isopropyl alcohol and paraffinic hydrocarbons such as pentane and hexane. The optical characteristics such as the sensitivity, transparency, and diffraction effect can be controlled to some extent by adjusting the dissolving powers of the solvents and/or by controlling the temperature of the solvents. In order to perform the development with improved reproducibility, preferably the dye or iodoform is removed before the swelling treatment.

Figure 2:
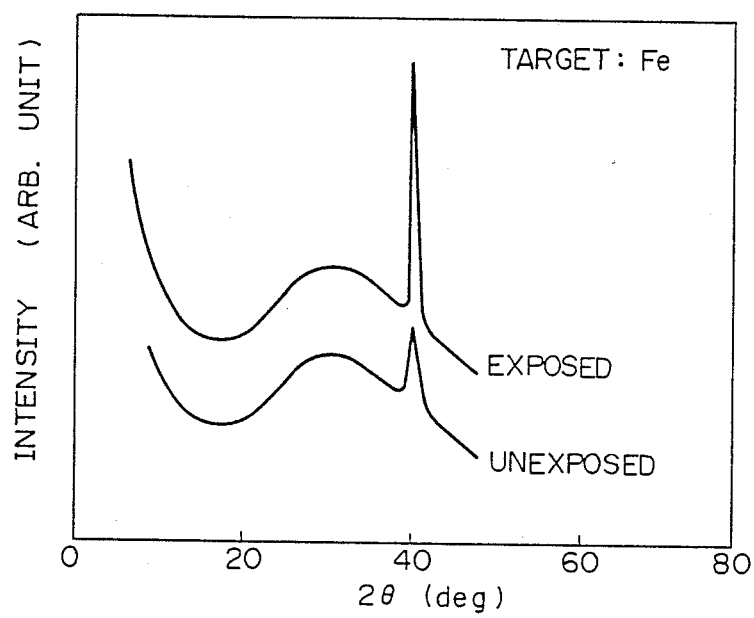
FIG. 2 shows X-ray diffraction spectra of the exposed film and unexposed film after the development in a hologram of poly-N-vinylcarbazole.

When the development treatment was carried out in the foregoing manner, the diffraction distribution was formed according to the intensity of the irradiated light, whereby a hologram was obtained. The exposed film and the unexposed film were compared after the development. Furthermore, the dissolution of PVCz in the developing solution was checked by liquid chromatography. It was found that although the film thickness was increased by the development, the film thickness in the unexposed area was larger than in the exposed area and the density in the unexposed area was lower than in the exposed area. Since a reduction of the density means a reduction of the refractive index, it may be said that a hologram was formed as a periodical distribution of the density. Accordingly, the X-ray diffraction spectra of the exposed area and the unexposed area were observed after the development. As the result, it was found that the crystallinity in the exposed area was extremely high (see FIG. 2). It is therefore considered that in the exposed area, crystallization is more readily caused at the development than in the unexposed area and reduction of the density is smaller than in the unexposed area. However, the reason why crystallization is readily caused in the exposed area is unknown. It is generally considered that the molecular weight of PVCz is increased by the crosslinking reaction or the like. From the results of the infrared absorption spectrum analysis, it was found that there is no detectable difference between the unexposed area and the area irradiated with light in a quantity 10 times the light quantity necessary for the production of a hologram. Therefore, there is a probability that a change other than an increase of the molecular weight takes place in PVCz.

TABLE

| Run No. | 1 | 2 | 3 | 4 | 5 | 6 | 7 | 8 | 9 | 10 | 11 |
|---|---|---|---|---|---|---|---|---|---|---|---|
| Amount of iodoform[1] | 10 | 10 | 10 | 10 | 10 | 10 | 5 | 10 | 20 | 40 | 80 |
| Amount of naphthacene[2] | 20 | 10 | 5 | 2 | 1 | 0.5 | 0 | 0 | 0 | 0 | 0 |
| Light exposure quantity[3] | 4 | 4 | 5 | 8 | 15 | 40 | 3000 | 900 | 500 | 200 | — |
| Remarks | | a | | | | | | | | b | c |

Note:
[1] Parts by weight of added iodoform per 100 parts by weight of PVCz.
[2] Parts by weight of added 5,6,11,12-tetraphenylnaphthacene per 100 parts by weight of PVCz.
[3] Light exposure quantity in mJ/cm$^2$ required to obtain a diffraction efficiency of at least 70%.
a This run corresponds to Example 1.
b The viscosity of the coating liquid was notably increased.
c Opaque regions were produced on the coated layer.

For the production, development should be carried out after the light exposure. As in the case of the production of a hologram by using gelatin dichromate, the film is swollen by a solvent having a relatively high dissolving power and the film is then contracted by a poor solvent. In the production of a hologram by using PVCz, as the good solvent, there can be used aromatic solvents such as benzene, toluene and xylene and chlorine type solvents such as trichloroethylene, dichlorobenzene and dichloroethane. These solvents may be As is apparent from the foregoing description, according to the present invention, there can be obtained a hologram recording material which has a superior moisture resistance and heat resistance to conventional recording materials and which is thermally stable, and in which recording is possible at a high density by visible laser beams such as argon ion laser beams.

The present invention will now be described in detail with reference to the following examples.

EXAMPLE 1

The following materials were mixed at room temperature to form a solution, and the solution was filtered by a filter having a mesh size of 2 μm to obtain a coating solution A or B.

| Coating Solution A | |
|---|---|
| Poly-N—vinyl carbazole (Mw = 570,000, Mw/Mn = 4.4) | 10 g |
| Iodoform | 1 g |
| 5,6,11,12-Tetraphenylnaphthacene (supplied by Aldrich) | 1 g |
| Chloroform | 240 g |
| Coating Solution B | |
| Poly-N—vinylcarbazole (Mw = 570,000, Mw/Mn = 4.4) | 10 g |
| Iodoform | 1 g |
| Chloroform | 240 g |

The above-mentioned sensitive solution A or B was spin-coated on a glass substrate having a size of 70 mm×70 mm in a dark place so that the film thickness after drying was 1.4 μm. Then, the coating substrate was heated at 60° C. for 30 minutes to obtain a photosensitive plate for hologram recording.

Figure 3:
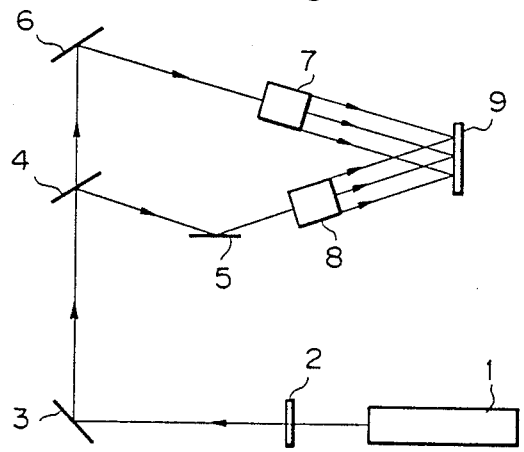
FIG. 3 is a block diagram showing a two-flux light exposure apparatus for the production of a hologram, in which reference numeral 1 represents a laser, reference numeral 2 represents a shutter, each of reference numerals 3, 5, and 6 represents a mirror, reference numeral 4 represents a half-mirror, each of reference numerals 7 and 8 represents a collimater, and reference numeral 9 represents a photosensitive plate.

By using a hologram-preparing optical system shown in FIG. 3, two-flux interference recording was effected on the photosensitive plate by using argon ion laser beams of 488 nm and argon ion laser beams of 515 nm. The light intensity was 0.1 mW/cm² and the space frequency was 1200 per mm. The light exposure energy was adjusted by changing the light exposure time.

After the light exposure, the film was immersed in xylene for 3 minutes to remove iodoform or phenylnaphthacene in the film, followed by air drying. Then, the film was immersed in a liquid mixture (17° C., or 14° to 16° C.) comprising 70% by weight of toluene and 30% by weight of xylene for 1 minute, and the film was immediately immersed in n-pentane (room temperature) and taken up therefrom to obtain a hologram.

FIGS. 4A and 4B show the relationship between the light exposure quantity and the diffraction efficiency (He—Ne laser was used), observed when the materials A and B were irradiated with rays having wavelengths of 488 nm and 515 nm. When rays having a wavelength of 488 nm are used, in order to prepare a hologram having a high diffraction efficiency by the material B containing iodoform alone, a light exposure quantity of 900 mJ/cm² is necessary. However, in the case of the material A containing tetraphenylnaphthacene in addition to iodoform, an equivalent diffraction efficiency can be obtained with a light quantity of 4 mJ/cm², that is, less than 1/200 of the light quantity necessary in the case of the material B. Namely, in the material A, the probability of occurrence of chemical reaction of PVCz by absorption of light in iodoform is less than 1%, and more than 99% of the chemical reaction in PVCz is due to the transfer of energy from tetraphenylnaphthacene.

The contribution of this transfer energy is much larger in the case of rays having a wavelength of 515 nm. In the case of the material B containing iodoform alone, no diffraction lattice is formed even if the material is irradiated with several thousand mJ/cm². In fact, the material B has no substantial sensitivity to rays having this wavelength. In contrast, a hologram having a high diffraction efficiency can be obtained with a light exposure quantity of 10 mJ/cm² if phenylnaphthace is used in combination with iodoform. As pointed out hereinbefore, phenylnaphthacene per se does not act as a reaction initiator to PVCz. Accordingly, in this case, the light-absorbing capacity is completely separated from the function of causing a reaction in PVCz.

When the coating solution A was stored at room temperature, the change of the viscosity was about +5%, and the light sensitivity and the characteristics of the obtained hologram were equivalent to those of the coating solution just after the preparation. When the moisture resistance of the hologram was examined by allowing it to stand in a thermostat tank maintained at a temperature of 50° C. and a relative humidity of 95%, reduction of the diffraction efficiency was not observed even after 10 days. Furthermore, when the heat resistance of the hologram was examined by subjecting it to a heat shock test comprising 5 cycles of −30° C.×1 hour and 80° C.×1 hour, reduction of the diffraction efficiency was not observed.

EXAMPLE 2

The following materials were mixed to form a solution, and the solution was filtered by a filter having a mesh size of 2 μm to obtain a coating solution C.

| Coating Solution C | |
|---|---|
| Poly-N—vinylcarbazole (Mw = 570,000, Mw/Mn = 4.4) | 10 g |
| Iodoform | 1 g |
| Bis(phenylethynyl)naphthacene of the following formula | 0.5 g |

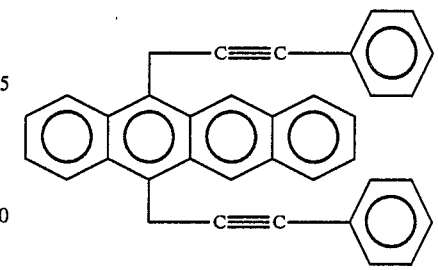

| Chloroform | 240 g |

By using this photosensitive solution C, a hologram was prepared in the same manner as described in Example 1. FIG. 4A shows the relationship between the light exposure quantity and the diffraction efficient (He—Ne laser was used), observed when rays having a wavelength of 488 nm were used.

We claim:
1. A visible ray-recording hologram material comprising a polymer containing a carbazole ring, iodoform, and a phenylnapthacene.
2. A hologram material as set forth in claim 1, capable of recording with rays having a wavelength of 450 to 550 nm.
3. A hologram material as set forth in claim 1, wherein the phenylnaphthacene is selected from 5,6,11,12-tetraphenylnaphthacene.
4. A hologram material as set forth in claim 1, wherein the carbazole ring-containing polymer is selected from the group consisting of polyvinyl carbazole, vinyl carbazole-styrene copolymer, vinyl carbazole-vinylidene chloride copolymer, vinyl carbazole-methyl methacrylate copolymer, vinyl carbazole-vinyl anthracene copolymer, vinyl carbazole-vinyl pyridine copoly- mer, vinyl carbazole-methyl acrylate copolymer, vinyl carbazole-ethyl acrylate copolymer, vinyl carbazole-acrylonitrile copolymer, vinyl carbazole-butyl acrylate copolymer, vinyl carbazole-nitrovinyl carbazole copolymer, nitrated polyvinyl carbazole, polyvinylamino carbazole, vinyl carbazole-N-methylaminovinyl carbazole copolymer, halogene substituted polyvinyl carbazole, vinyl carbazole-dibromovinyl carbazole copolymer, polyiodovinyl carbazole, polybenzilidene vinyl carbazole, polypropenyl carbazole, and a polymer having an ester linkage between the main chain and the carbazole ring.

5. A hologram material as set forth in claim 4, wherein the carbazole ring-containing polymer is selected from:

(1) a poly-N-vinylcarbazole of the following formula,

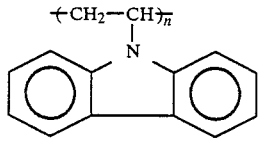

wherein n is a positive integer, (2) a halogen-substituted poly-N-vinylcarbazole of the following formula,

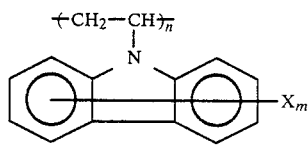

wherein X stands for Cl, Br or I, m is an integer of from 1 to 3, and n is a positive integer, and, (3) a polymer having an ester linkage between the main chain and the carbazole ring, which is represented by the following formula:

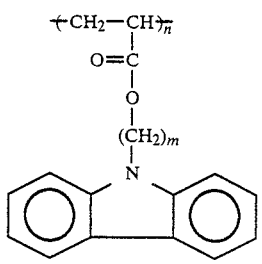

wherein m is an integer of from 1 to 3 and n is a positive integer.

6. A hologram material as set forth in claim 1, wherein iodoform is contained in an amount of 1 to 40 parts by weight per 100 parts by weight of the carbazole ring-containing polymer.

7. A hologram material as set forth in claim 6, wherein the content of iodoform is 5 to 20 parts by weight.

8. A hologram material as set forth in claim 1, wherein the phenylnapthacene is contained in an amount of 0.1 to 40 parts by weight per 100 parts of the carbazole ring-containing polymer.

9. A hologram material as set forth in claim 8, wherein the content of the phenylnapthacene is 0.5 to 10 parts by weight.

* * * * *